United States Patent
Ohmi et al.

(10) Patent No.: US 6,650,678 B1
(45) Date of Patent: Nov. 18, 2003

(54) LASER OSCILLATING APPARATUS

(75) Inventors: Tadahiro Ohmi, 1-17-301, Komegafukuro 2-chome, Aoba-ku, Sendai-shi, Miyagi-ken (JP); Nobumasa Suzuki, Utsunomiya (JP); Hiroshi Ohsawa, Utsunomiya (JP); Nobuyoshi Tanaka, Tokyo (JP); Toshikuni Shinohara, Sendai (JP); Masaki Hirayama, Sendai (JP)

(73) Assignees: Canon Kabushiki Kaisha, Tokyo (JP); Tadahiro Ohmi, Sendai (JP)

( * ) Notice: Subject to any disclaimer, the term of this patent is extended or adjusted under 35 U.S.C. 154(b) by 0 days.

(21) Appl. No.: 09/512,075

(22) Filed: Feb. 24, 2000

(30) Foreign Application Priority Data

Feb. 26, 1999 (JP) .............................. 11-051814

(51) Int. Cl.$^7$ ................................ A01S 3/097
(52) U.S. Cl. ....................... 372/82; 372/69; 372/81
(58) Field of Search ................ 372/57–64, 69–74, 372/76, 85, 87, 90

(56) References Cited

U.S. PATENT DOCUMENTS

| | | | | |
|---|---|---|---|---|
| 4,004,249 A | * | 1/1977 | Kikuchi ........................ | 372/58 |
| 4,513,424 A | * | 4/1985 | Waynant et al. ............... | 372/68 |
| 4,802,183 A | * | 1/1989 | Harris et al. .................. | 372/57 |
| 5,224,117 A | * | 6/1993 | Kruger et al. ................. | 372/82 |
| 5,255,282 A | * | 10/1993 | Remo ........................... | 372/82 |
| 5,347,530 A | * | 9/1994 | Gekat et al. .................. | 372/82 |
| 5,450,436 A | * | 9/1995 | Mizoguchi et al. ............ | 372/59 |
| 5,517,608 A | | 5/1996 | Suzuki et al. | |
| 5,642,374 A | * | 6/1997 | Wakabayashi et al. ......... | 372/57 |
| 5,696,428 A | * | 12/1997 | Pasch ...................... | 315/111.21 |
| 5,900,103 A | * | 5/1999 | Tomoyasu et al. ...... | 156/345.44 |
| 5,981,075 A | * | 11/1999 | Ohmi et al. ................. | 428/428 |
| 6,282,221 B1 | * | 8/2001 | Ohmi et al. .................. | 372/57 |
| 6,331,994 B1 | * | 12/2001 | Ohmi et al. .................. | 372/82 |
| 6,357,385 B1 | * | 3/2002 | Ohmi et al. ........... | 118/723 AN |
| 6,372,646 B2 | * | 4/2002 | Ohmi et al. ................. | 438/689 |

FOREIGN PATENT DOCUMENTS

EP           0 820 132        1/1998

OTHER PUBLICATIONS

A. Mendelsohn, et al., "A Microwave–Pumped XeCl* Laser," Applied Physics Letter vol. 38, No. 8, pp. 603–605 (Apr. 1981).

* cited by examiner

Primary Examiner—Paul Ip
Assistant Examiner—Tuan Nguyen
(74) Attorney, Agent, or Firm—Fitzpatrick, Cella, Harper & Scinto

(57) ABSTRACT

A plasma is excited uniformly as a whole over the length of each slot. A laser oscillating apparatus is designed to excite a laser gas in a laser tube (2) by introducing electromagnetic waves into the laser tube through a plurality of slots (10) formed in a waveguide wall and generate a laser beam by resonating the light generated from the laser gas. A least one electrode (13) is placed near the slot (10). By giving a predetermined current density to the electrode (13), the intensity distribution of light generated from the laser gas above the slot (10) is controlled.

30 Claims, 13 Drawing Sheets

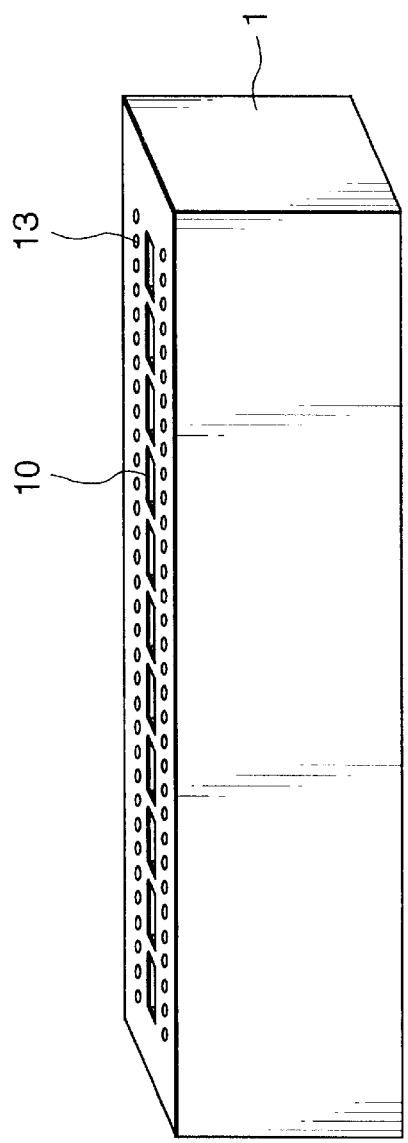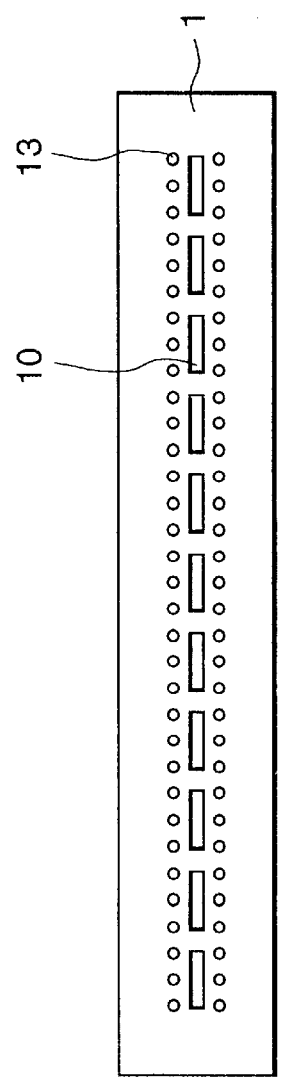
FIG. 2A
FIG. 2B

UNIFORM PREIONIZATION

CURRENT DENSITY DISTRIBUTION

NONUNIFORM PITCH

UNIFORM PREIONIZATION

NONUNIFORM ELECTRODE

NON-EQUIDISTANT ELECTRODES

BACK MIRROR COMPENSATION

ULTRAVIOLET IRRADIATION MECHANISM
( SECTION IN SLOT SHORT-AXIS DIRECTION )

EXAMPLE OF IRRADIATION SCHEME USING
BEND WAVEGUIDE ( ELBOW )

ULTRAVIOLET IRRADIATION MECHANISM
(SECTION IN SLOT LONG-AXIS DIRECTION)

EXAMPLE OF PLACEMENT OF UV TRANSMISSION WINDOWS

EXAMPLE OF PLACEMENT OF UV TRANSMISSION WINDOWS

SECTIONAL VIEW IN SLOT LONG-AXIS DIRECTION

SECTIONAL VIEW IN SLOT LONG-AXIS DIRECTION

SECTIONAL VIEW IN SLOT LONG-AXIS DIRECTION

EXAMPLE OF ELECTRIC FIELD
INTENSITY DISTRIBUTION NEAR SLOT

PLASMA DENSITY
WITHOUT COMPENSATION

LASER OSCILLATING APPARATUS

FIELD OF THE INVENTION

The present invention relates to a laser oscillating apparatus for generating a laser beam by introducing an electromagnetic wave from a waveguide into a laser tube through a plurality of fine slots formed in the waveguide wall and, for example, to a laser oscillating apparatus using a microwave as an electromagnetic wave for exciting a laser gas, an exposure apparatus using the same, and a device fabrication method using the same.

BACKGROUND OF THE INVENTION

Recently, a so-called excimer laser has attracted attention as the only high-output laser which oscillates in the ultraviolet region. This excimer laser is expected to be applied to the electronic, chemical, and energy industries, particularly processing and chemical reactions of metals, resins, glass, ceramics, and semiconductors.

The principle of function of an excimer laser oscillator will be described below. First, laser gases such as Ar, Kr, Ne, $F_2$, He, Xe, $Cl_2$, and the like contained in a laser tube are excited by electron beam irradiation or discharge. Excited F atoms bond to inert Kr and Ar atoms in the ground state to generate KrF★ and ArF★ as molecules existing only in an excited state. These molecules are called excimers. Since excimers are unstable, they immediately emit ultraviolet rays and fall to the ground state. This phenomenon is called spontaneous emission. An excimer laser oscillator uses this light to amplify as an in-phase beam in an optical resonator constructed of a pair of reflecting mirrors and extract as a laser beam.

In the case of excimer laser emission, microwaves are used as a laser gas exciting source. Microwaves are electromagnetic waves having an oscillation frequency of a few hundred MHz to several tens of GHz. In this case, a microwave is introduced from a waveguide into a laser tube through a slot formed in the waveguide wall, thereby exciting a laser gas in the laser tube into a plasma.

It is, however, difficult to uniformize the radiation characteristic of an electromagnetic wave from a slot formed in a waveguide wall in an entire region over the slot. Usually, the distribution is a sinusoidal distribution in the slot long-axis direction or a similar distribution. That is, as shown in FIG. 13A, an electric field intensity distribution in the center along the long-axis direction of each slot is largest, and the field intensity distribution at the ends in the long-axis direction of each slot is smallest.

Additionally, an excited plasma has a property of concentrating to the center in the long-axis direction of each slot with respect to the microwave field intensity distribution. This promotes the nonuniform distribution of the field intensity in the slot long-axis direction. This is a great cause of preventing a uniform distribution of an excited plasma in the long-axis direction of each slot.

This phenomenon is caused by the property that a plasma is easily excited in a central position along the longitudinal direction of each slot because the intensity of an electromagnetic wave as an excitation source is a maximum in this central position, and by the property that the excited plasma readily concentrates to have the smallest surface area in the form of a sphere. This plasma excited in the central position forms a region having a low spatial impedance in the center of the slot. This portion preferentially consumes energy.

Also, the plasma functions as a shield to reduce the slot length, and a slot designed to have a length corresponding to a microwave emission portion actually functions as a slot having a length half the designed length. As a consequence, no microwave is emitted outside the slot. By these two factors, a plasma is readily formed only in the center of a slot, and it is very difficult to excite a uniform plasma over the slot, as shown in FIG. 13B.

SUMMARY OF THE INVENTION

The present invention has been made to solve the above problems, and has as its object to control the excited state distribution of a laser gas in the longitudinal direction of each slot in a slot array structure so as to uniformly excite the laser gas over the length of each slot with minimum energy loss.

According to the present invention, there is provided a laser oscillating apparatus for generating a laser beam by introducing an electromagnetic wave into a laser tube filled with a laser gas through a slot formed in a waveguide wall characterized by comprising an energy supplying portion for supplying energy to the laser gas to control an excited state distribution of the laser gas independently of introducing the electromagnetic wave into the laser tube through the slot.

In the laser oscillating apparatus according to the present invention, the energy supplying portion preferably supplies energy to the laser gas so as to substantially uniformly excite the laser gas along the slot.

In the laser oscillating apparatus according to the present invention, the energy supplying portion preferably includes, near the slot, an electrode for supplying energy to the laser gas.

In the laser oscillating apparatus according to the present invention, the energy supplying portion preferably ionizes the laser gas by supplying energy to the laser gas using the electrode.

In the laser oscillating apparatus according to the present invention, it is preferable that the energy supplying portion preliminarily ionize the laser gas before supplying an electromagnetic wave through the waveguide.

In the laser oscillating apparatus according to the present invention, the electrode preferably supplies energy to the laser gas to make an ionization density near an end portion of the slot higher than an ionization density near a central portion of the slot.

In the laser oscillating apparatus according to the present invention, the energy supplying portion preferably includes, near the slot, at least one pair of electrodes for supplying energy to the laser gas, and the at least one pair of electrodes are arranged to make an ionization density near an end portion of the slot higher than an ionization density near a central portion of the slot.

In the laser oscillating apparatus according to the present invention, it is preferable that the energy supplying portion include at least one pair of electrodes for supplying energy to the laser gas, and the at least one pair of electrodes be shaped to make an ionization density near an end portion of the slot higher than an ionization density near a central portion of the slot.

In the laser oscillating apparatus according to the present invention, it is preferable that the energy supplying portion include, near the slot, a plurality of electrode pairs for supplying energy to the laser gas, and a current with a current density higher than a current density of a current supplied between the electrode pair near a central portion of the slot be supplied between the electrode pair near an end portion of the slot.

In the laser oscillating apparatus according to the present invention, it is preferable that the energy supplying portion include, near the slot, a plurality of electrode pairs for supplying energy to the laser gas, and the plurality of electrode pairs concentrate near an end portion of the slot.

In the laser oscillating apparatus according to the present invention, it is preferable that the energy supplying portion include, along the slot, one pair of electrodes for supplying energy to the laser gas, and each of the pair of electrode be wider near an end portion of the slot than near a central portion of the slot.

In the laser oscillating apparatus according to the present invention, it is preferable that the energy supplying portion include, near the slot, a plurality of electrode pairs for supplying energy to the laser gas, and the electrode pair near an end portion of the slot be located nearer to the slot than the electrode pair near a central portion of the slot.

In the laser oscillating apparatus according to the present invention, the energy supplying portion preferably supplies energy to the laser gas to make an ionization density near an end portion of the slot higher than an ionization density near a central portion of the slot.

In the laser oscillating apparatus according to the present invention, the energy supplying portion preferably includes a light source for irradiating a portion near the slot with light.

In the laser oscillating apparatus according to the present invention, it is preferable that the waveguide be placed between the light source and the laser tube, and one surface of the waveguide have a window transmitting light from the light source.

In the laser oscillating apparatus according to the present invention, the surface of the waveguide in which the window is preferably formed opposes a surface of the waveguide in which the slot is formed.

In the laser oscillating apparatus according to the present invention, the window preferably has a size that disables the electromagnetic wave from passing through.

In the laser oscillating apparatus according to the present invention, the energy supplying portion preferably further includes a reflecting mirror for reflecting light from the light source toward a portion near the slot.

In the laser oscillating apparatus according to the present invention, the light source preferably generate ultraviolet light.

In the laser oscillating apparatus according to the present invention, the plurality of slots are preferably formed in the waveguide.

In the laser oscillating apparatus according to the present invention, the plurality of slots are preferably formed along a longitudinal direction of the waveguide.

In the laser oscillating apparatus according to the present invention, the energy supplying portion is preferably provided for each slot.

According to the present invention, there is provided an exposure apparatus including a laser oscillating unit, an illumination optical system for generating illuminating light for illuminating a mask by using a laser light supplied from the laser oscillating unit, and a projection optical system for projecting a pattern of the mask illuminated with the illuminating light generated by the optical system onto a substrate, characterized in that the laser oscillating unit generates the laser beam by introducing an electromagnetic wave into a laser tube filled with a laser gas through a slot formed in a waveguide wall, and the unit comprises an energy supplying portion for supplying energy to the laser gas to control an excited state distribution of the laser gas independently of introducing the electromagnetic wave into the laser tube through the slot.

According to the present invention, there is provided a device manufacturing method characterized by comprising the steps of coating a substrate with a photosensitive material, exposing a pattern on the substrate coated with the photosensitive material by using the exposure apparatus defined in claim 23, and developing the pattern on the exposed substrate.

Further objects, features and advantages of the present invention will become apparent from the following detailed description of embodiments of the present invention with reference to the accompanying drawings.

BRIEF DESCRIPTION OF THE DRAWINGS

FIGS. 2A and 2B are schematic views showing the detailed arrangement of a waveguide of the excimer laser oscillating apparatus according to the first embodiment of the present invention;

DETAILED DESCRIPTION OF THE PREFERRED EMBODIMENTS

Preferred embodiments of the present invention will now be described in detail in accordance with the accompanying drawings.

First Embodiment

Figure 1:
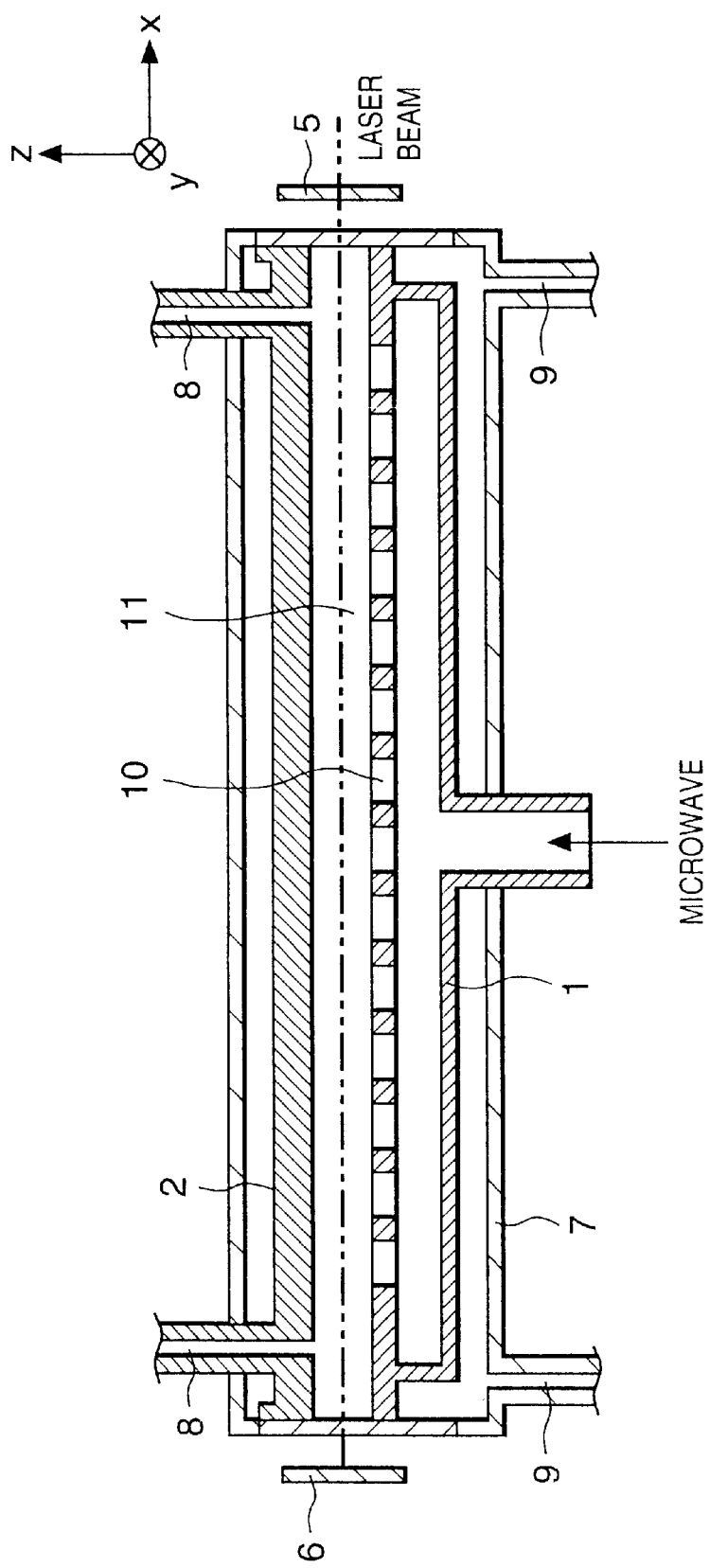
FIG. 1 is a sectional view showing the main parts of an excimer laser oscillating apparatus according to the first embodiment of the present invention.

The first embodiment will be described below. In this embodiment, an excimer laser oscillator which emits a so-called excimer laser beam will be explained. FIG. 1 is a schematic view showing the main parts of the excimer laser oscillator of this embodiment.

As shown in FIG. 1, this excimer laser oscillator includes a laser tube 2, waveguide 1, and cooling vessel 7. The laser tube 2 emits a laser beam by resonating light generated by the excitation of an excimer laser gas. The waveguide 1 excites the excimer laser gas in the laser tube 2 to generate a plasma. The cooling vessel 7 has cooling water inlet/output ports 9 for cooling the waveguide 1.

The excimer laser gas as a material for generating an excimer laser beam is at least one inert gas selected from Kr, Ar, Ne, and He or a gas mixture of at least one inert gas described above and $F_2$ gas. These gases can be appropriately selected and used in accordance with the wavelength of interest. For example, KrF is used when a laser beam with a wavelength of 248 nm is to be generated; ArF is used when a laser beam with a wavelength of 193 nm is to be generated; $F_2$ is used when a laser beam with a wavelength of 157 nm is to be generated; $Kr_2$ is used when a laser beam with a wavelength of 147 nm is to be generated; ArKr is used when a laser beam with a wavelength of 134 nm is to be generated; and $Ar_2$ is used when a laser beam with a wavelength of 126 nm is to be generated.

The laser tube 2 has laser gas inlet/output ports 8 through which the excimer laser gas is introduced into the tube, and reflecting structures 5 and 6 at the two end portions. These reflecting structures 5 and 6 equalize the phases of light by plasma discharge and generate a laser beam.

The waveguide 1 is a means for supplying a microwave to the laser gas in a gas supply passage structure 11. A plurality of long and narrow slots 10 are formed in the upper surface of the waveguide 1. When a microwave with a frequency of a few hundred MHz to several tens of GHz is introduced from the lower portion of the waveguide 1 shown in FIG. 1, this microwave propagates in the waveguide 1 and is emitted from the slots 10 and introduced/transmitted into laser tube 2. The microwave thus introduced excites the excimer laser gas in the laser tube 2, thereby generating an excimer laser beam by resonance.

FIGS. 2A and 2B show the practical structure of the waveguide 1. FIG. 2A is a schematic perspective view of the waveguide 1. FIG. 2B is a plan view of the waveguide 1.

As shown in FIG. 2B, the slots 10 are arranged in a line such that their longitudinal direction is consistent with the longitudinal direction of the waveguide 1. Electrodes 13 are so formed as to surround these slots 10. In this case, either DC voltage or AC voltage (including RF voltage) may be applied to the electrodes 13.

Figure 3A:
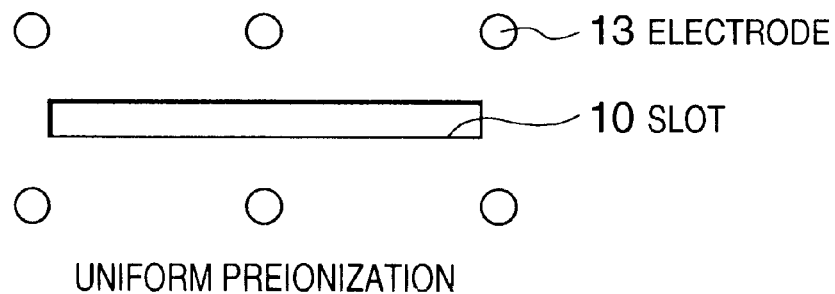
FIGS. 3A to 3C are plan views showing practical examples of electrodes formed near a slot in the waveguide according to the first embodiment of the present invention.
Figure 3B:
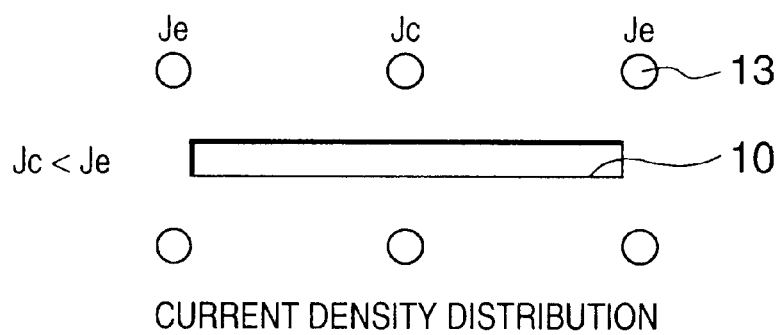
Figure 3C:
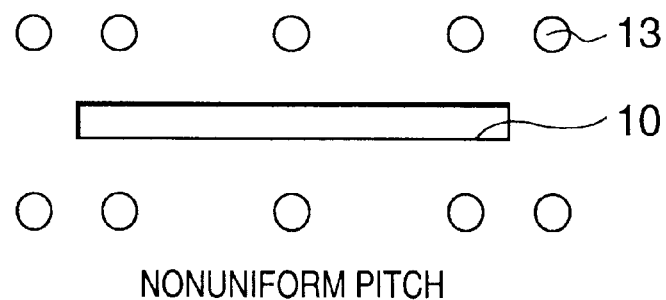

FIGS. 3A to 3C show examples of the arrangement of electrodes 13 formed around an arbitrary slot 10. The electrodes 13 are used to ionize a laser gas before microwaves are supplied. Like FIG. 2B, FIG. 3A shows an example of the arrangement of six electrodes around the slot 10.

FIG. 3B shows the densities of currents applied to the six electrodes 13. Let $J_c$ be the current density at the electrode 13 located near the middle of the slot 10 in the longitudinal direction, and $J_e$ be the current density at the electrode 13 located at each end portion of the slot in the longitudinal direction. The current densities are adjusted to meet $J_c < J_e$.

If the current density at each end portion of the slot 10 is set to be higher than that at the central portion of the slot 10 in this manner, the densities of electrons generated by preionization have a predetermined distribution. This allows a plasma to be readily excited at each end portion of the slot.

That is, the electron density distribution produced by the electrode 13 can compensate for the formation of an electrically ON state in the widthwise direction of the slot 10 upon excitation of a plasma. In the case shown in FIG. 3B, the current density at each end of the slot 10 is set to be higher than that at the central portion of the slot 10. However, the formation of an electron density distribution is not limited to this. An appropriate electron density distribution can be formed by using the electrode 13 in accordance with the operation state.

As described above, a plasma is readily excited near the center of the slot 10 in the longitudinal direction. By promoting the excitation of a plasma at each end portion of the slot 10, therefore, a uniform plasma can be formed over the entire region above the slot 10.

Figure 5A:
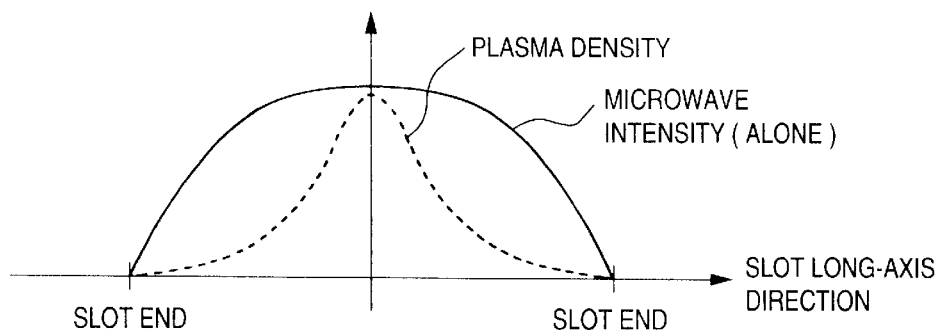
FIGS. 5A to 5C are schematic views showing how excitation of a plasma is uniformized by preionization compensation in the first embodiment of the present invention.
Figure 5B:
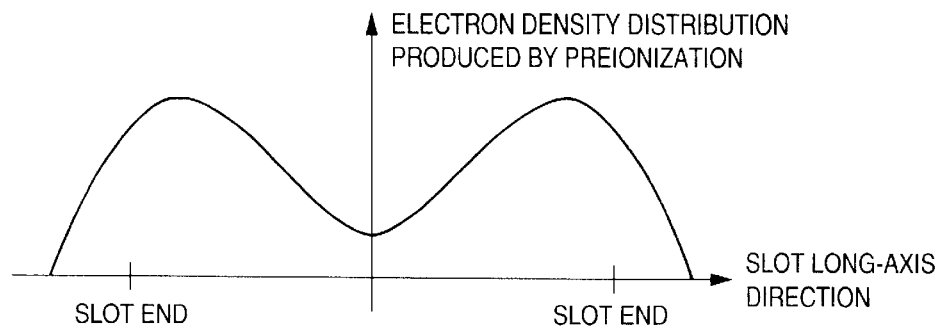
Figure 5C:
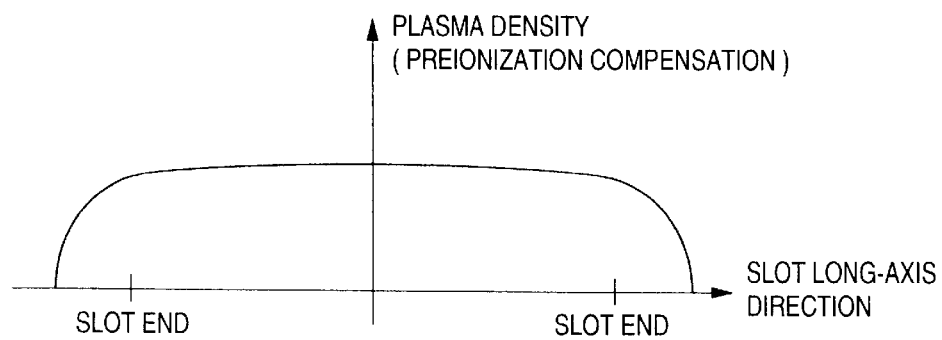

FIGS. 5A to 5C are graphs schematically showing the effects of uniformizing plasma excitation by preionization using the electrode 13. FIG. 5A shows, for comparison, the state of plasma excitation in the longitudinal direction of the slot 10 without any electrode 13. FIG. 5B is a graph schematically showing an electron density distribution (preionization compensation) in the longitudinal direction of the slot 10 which originates from a current density given to each electrode 13.

FIG. 5C shows the density of a plasma excited by microwaves emitted from the slot 10 in a case wherein preionization compensation in FIG. 5B is performed by the electrode 13. By applying the electric field shown in FIG. 5B in this manner, a plasma at each end portion of the slot 10 in the longitudinal direction can be promoted, and hence the state of plasma excitation over the entire region of the slot 10 can be uniformized, as shown in FIG. 5C.

FIGS. 3C and 4A to 4C show other arrangements of the electrodes 13. FIG. 3C shows a case wherein the number of electrodes 13 at each end portion of the slot 10 is increased to further facilitate excitation of the laser gas at each end portion of the slot 10. This arrangement allows more effective plasma excitation at each end portion of the slot 10.

Figure 4A:
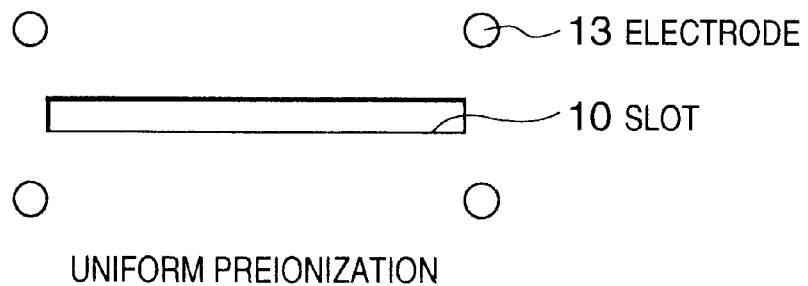
FIGS. 4A to 4C are plan views showing practical examples of electrodes formed near a slot in the waveguide according to the first embodiment of the present invention.

FIG. 4A shows a case wherein the electrodes 13 are formed at only the end portions of the slot 10 while no electrodes 13 are formed at the central portion of the slot 10 at which the laser gas is readily excited. The formation of the electrodes 13 only at the end portions of the slot 10, at which the laser gas is not readily excited, ensures a plasma density equal to that at the central portion of the slot 10, thereby uniformizing the plasma density in the entire region above the slot 10.

Figure 4B:
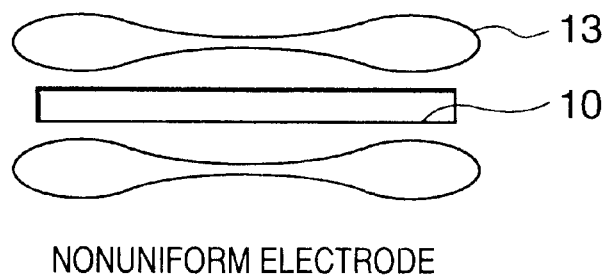

FIG. 4B shows a case wherein the electrodes 13 are integrally formed along the longitudinal direction of the slot 10. In this case, the electron density distribution at each end portion of the slot 10 can be increased by reducing the area of the central portion of each electrode 13 in the longitudinal direction of the slot 10.

Figure 4C:
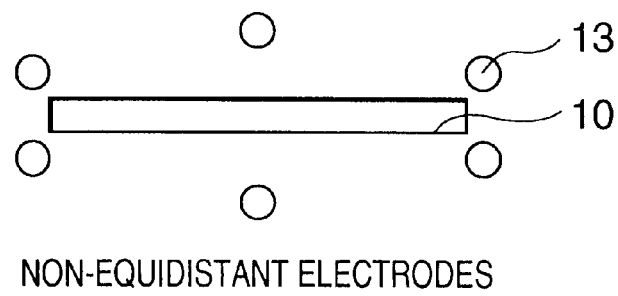

FIG. 4C shows a case wherein the electrodes 13 are located near the slot 10 at each end portion of the slot 10 at which the laser gas is not readily excited. By increasing the electron density at each end portion of the slot 10, excitation of the laser gas at each end portion of the slot 10 can be promoted. This makes it possible to uniformize laser gas excitation (plasma density) on the slot 10.

Figure 6:
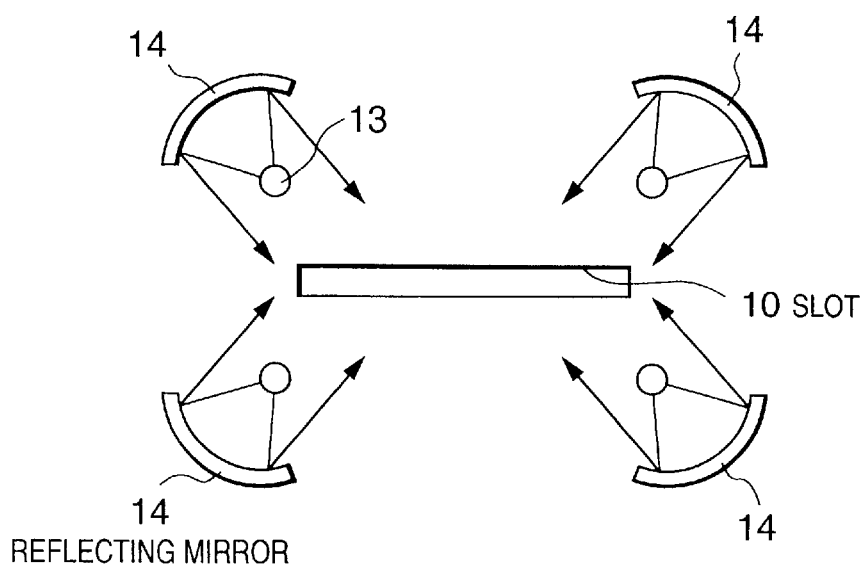
FIG. 6 is a schematic view showing how preionization compensation is performed by using reflecting mirrors in the first embodiment of the present invention.

FIG. 6 shows an arrangement in which the electrodes 13 are spaced apart from the slot 10. When the electrodes 13 are to be spaced apart from the slot 10 in this manner, efficient preionization can be realized by increasing the current density on the slot 10 side by using reflecting mirrors 14. In this case, since the laser gas flows above the waveguide 1, the reflecting mirrors 14 are preferably mounted above the flow path of the laser gas.

As described above, according to the first embodiment of the present invention, the electrodes 13 are arranged near each slot 10 to increase the electron density at each end portion of the slot 10 in the longitudinal direction as compared with the electron density at the central portion of the slot 10 in the longitudinal direction, thereby promoting excitation of the laser gas at each end portion of the slot 10 in the longitudinal direction, in particular. This makes it possible to uniformize a laser gas excitation state (plasma density) in the entire region of the slot 10.

Second Embodiment

Figure 7A:
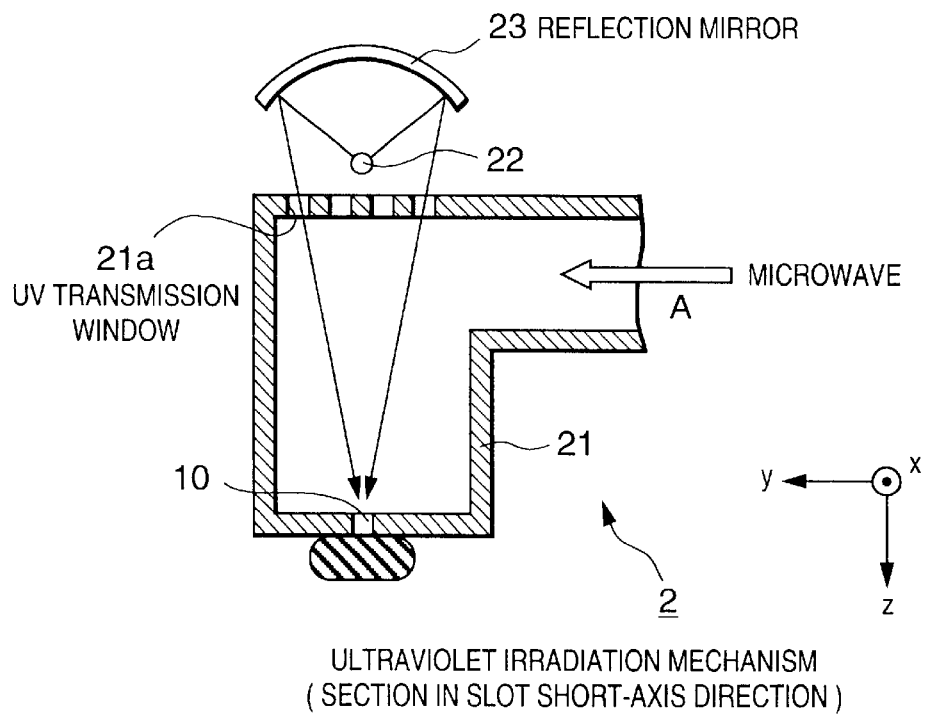
FIGS. 7A and 7B are sectional views each showing an ultraviolet irradiation mechanism in the second embodiment of the present invention.
Figure 7B:
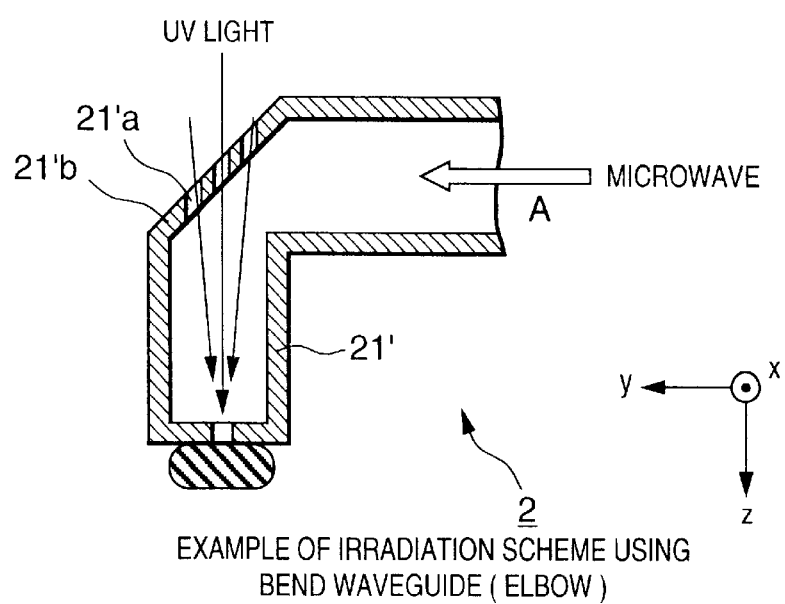

The second embodiment of the present invention will be described next. FIGS. 7A and 7B are schematic sectional views each showing a waveguide of an excimer laser oscillating apparatus according to the second embodiment of the present invention. The waveguide in the second embodiment is designed to replace the waveguide in the first embodiment, and the overall arrangement of the excimer laser oscillating apparatus is the same as that of the first embodiment. For this reason, the same reference numerals as in the first embodiment denote substantially the same parts in the second embodiment, and a detailed description thereof will be omitted.

A method of performing UV irradiation compensation by using ultraviolet light source in the second embodiment will be described below.

FIG. 7A is a sectional view taken along a direction perpendicular to the longitudinal direction of a waveguide 21. As shown in FIG. 7A, the waveguide 21 of the excimer laser oscillating apparatus according to the second embodiment has a substantially L-shaped sectional shape.

Slots 10 are formed in the lower surface of the waveguide 21. A microwave is introduced into the waveguide 21 in the direction indicated by an arrow A in FIG. 7A and emitted into a laser tube 2 through the slot 10, thereby exciting a plasma above the slot 10.

In the waveguide 21, a UV transmission window 21a is formed at a position opposing the slot 10. A UV light source 22 and reflecting mirror 23 are arranged outside the UV transmission window 21a.

In this embodiment, the substantially L-shaped sectional shape of the waveguide 21 makes it possible to directly perform UV irradiation from the position opposing the slot 10. In addition, the formation of the UV transmission window 21a having a predetermined size can prevent microwaves from leaking through the UV transmission window 21a.

FIG. 7B is a sectional view taken along a direction perpendicular to the longitudinal direction of a bend waveguide 21'. When the bend waveguide 21' is used, a UV transmission window 21'a is formed in an inclined surface 21'b to allow direct UV irradiation from a position opposing the slot 10 as in the case of the waveguide 21 in FIG. 7A.

Figure 8A:
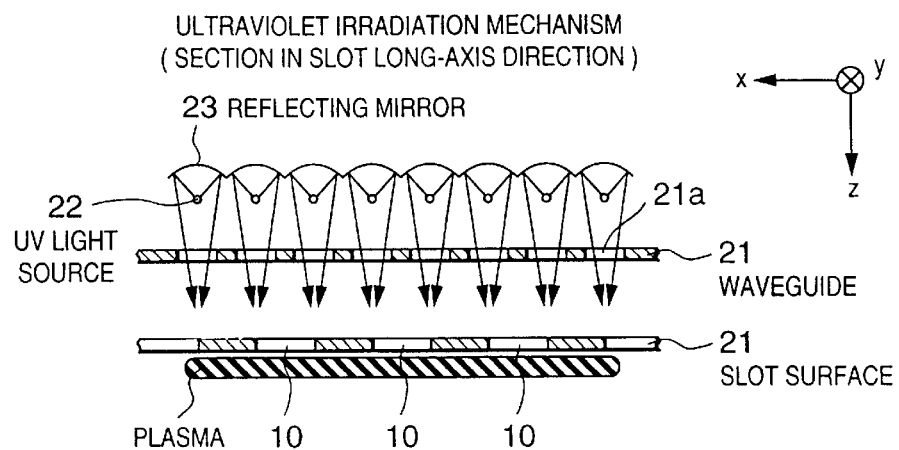
FIGS. 8A to 8C are schematic views showing the positions of ultraviolet irradiation and the positions of transmission windows for ultraviolet irradiation.

FIG. 8A is a sectional view taken along the longitudinal direction of the waveguide 21. The UV transmission windows 21a are formed along the longitudinal direction of the waveguide 21. The UV light sources 22 and reflecting mirrors 23 are arranged in accordance with the positions of the UV transmission windows 21a. The UV light sources 22 and reflecting mirrors 23 are so located as to concentrate UV irradiation on the end portions of the slots 10 in the longitudinal direction.

By concentrating UV irradiation on the end portions of each slot 10 in this manner, excitation of the laser gas at the end portions of the slot 10 can be promoted. This makes it possible to uniformly generate a plasma on each slot 10.

As the reflecting mirror 23, a reflecting mirror having a spherical surface or any aspherical surface (e.g., an elliptic or hyperbolic shape) can be used. In addition, a plurality of lenses may be used in place of the reflecting mirror 23, together with a single light source.

Figure 8B:
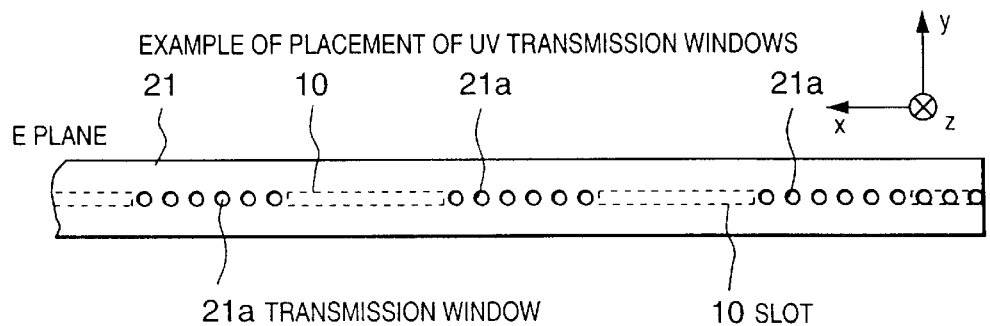
Figure 8C:
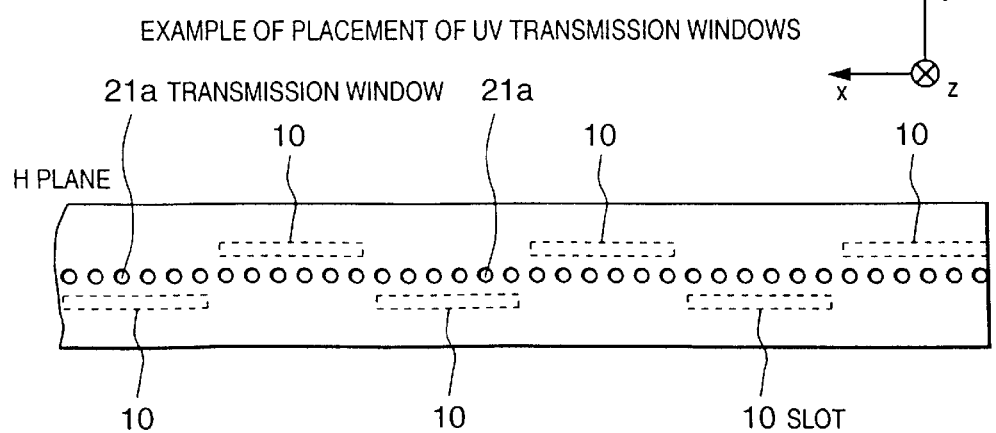

FIGS. 8B and 8C show the arrangement of UV transmission windows 21a as a microwave mode which is suited for a case wherein E and H planes are used. In general, a wall of a rectangular waveguide which is parallel to an electric field is referred to as an E plane, and a wall of the waveguide which is parallel to a magnetic field is referred to as an H plane. For example, according to a waveguide designed to propagate only the general TE10 mode, an E plane is a long end face of the waveguide, and an H plane is a short end face of the waveguide. As shown in FIG. 8B, when the E plane is used, the UV transmission windows 21a are preferably formed along the longitudinal direction of the slots 10. This arrangement makes it possible to concentrate UV irradiation on the end portions of each slot 10.

As shown in FIG. 8C, when the H plane is used and the slots 10 are arranged in two lines, the UV transmission windows 21a are preferably arranged along the longitudinal direction of the slots 10 to be located between the two lines of slots 10. When the H plane is used and the slots 10 are arranged in two lines to form two emission lines, transmission windows are preferably arranged for the respective two lines of slots 10 as in the case wherein the E plane is used.

Figure 9A:
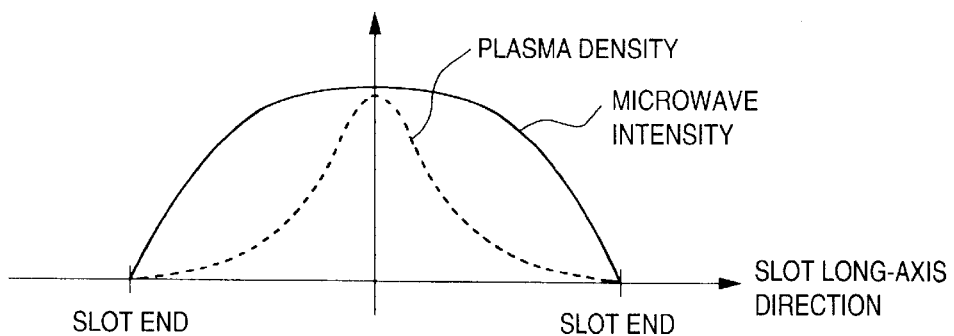
FIGS. 9A to 9C are schematic views showing how excitation of a plasma is uniformized by ultraviolet irradiation in the second embodiment of the present invention.
Figure 9B:
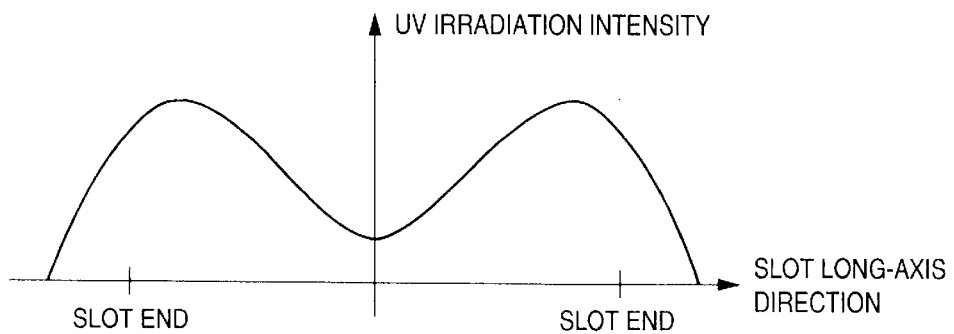
Figure 9C:
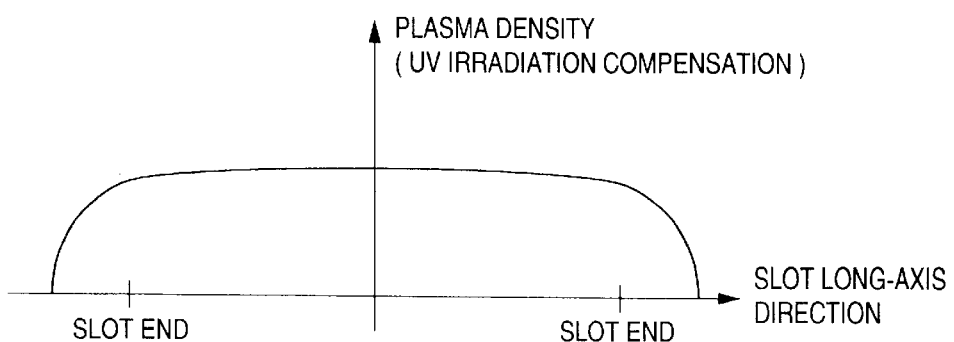

FIGS. 9A to 9C are graphs each schematically showing how plasma excitation is uniformized by UV irradiation. FIG. 9A shows a laser gas excitation state (plasma density) without any UV irradiation for comparison. FIG. 9B is a graph schematically showing the UV irradiation intensity of the UV light source 22 near the slot 10.

FIG. 9C shows the laser gas (plasma density) excited by a microwave radiated from the slot 10 when the UV irradiation shown in FIG. 9B is performed. By performing the UV irradiation shown in FIG. 9B, excitation of the laser gas at each end portion of the slot 10 in the longitudinal direction, in particular, can be promoted. As shown in FIG. 9C, a laser gas excitation state (plasma density) in the entire region of the slot 10 can be uniformized.

As described above, in the second embodiment of the present invention, since the UV light sources 22 are arranged to concentrate UV irradiation on the end portions of the slots 10 in the longitudinal direction, excitation of the laser gas at the end portions of the slots 10, at which the laser gas is not readily excited, can be promoted by UV irradiation. This makes it possible to uniformize excitation of the laser gas at the central portion and end portions of each slot 10 in the longitudinal direction, thus uniformly exciting the laser gas in the entire range on each slot 10. In the present invention, the same effect as described above can be obtained by using X-ray or RF (Radio Frequency) preionization instead of UV irradiation.

Third Embodiment

Figure 10:
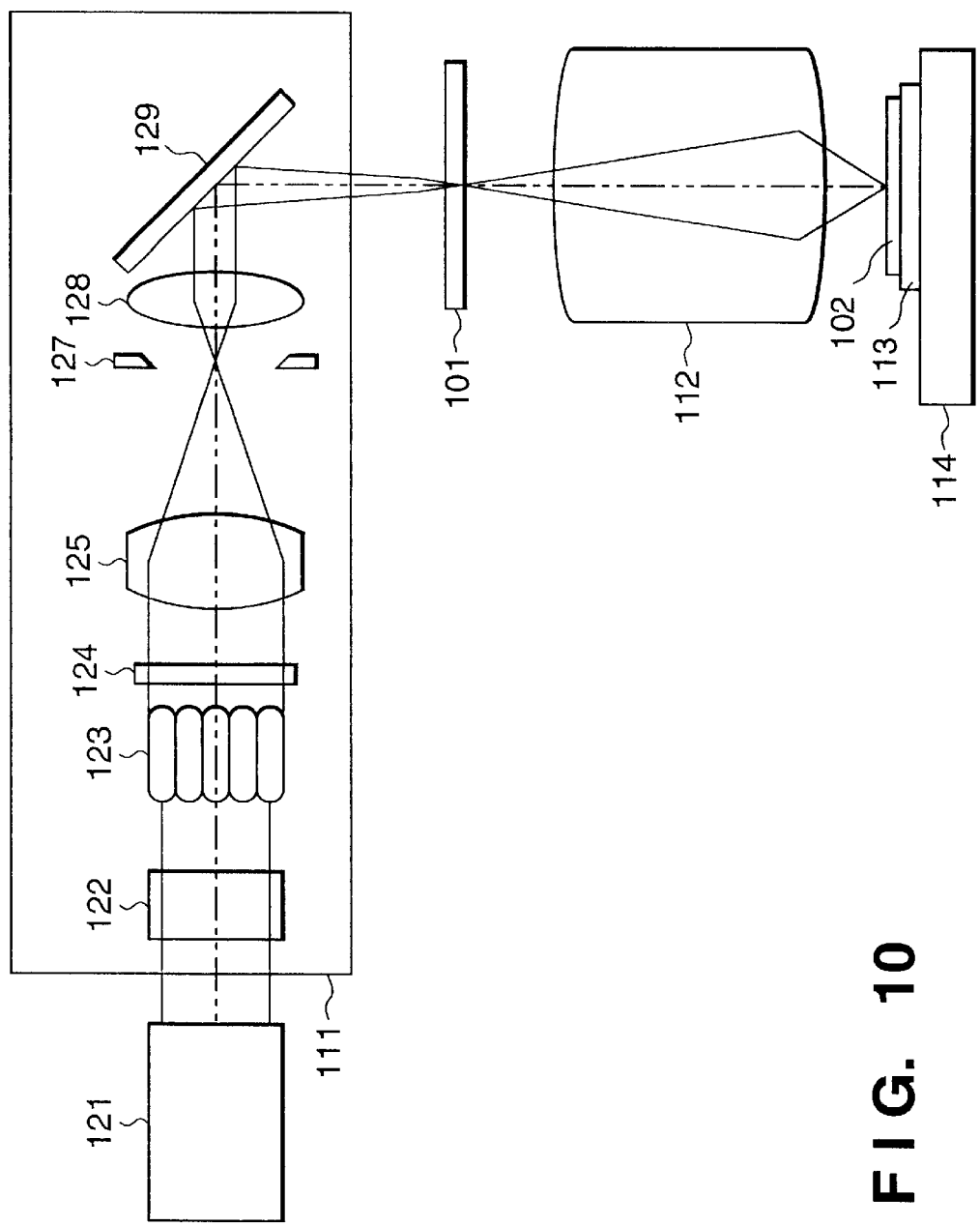
FIG. 10 is a schematic view showing a stepper according to the third embodiment of the present invention.

The third embodiment will be described below. In the third embodiment, an exposure apparatus (e.g., a stepper) having the excimer laser oscillator described in any of the second embodiment as a laser source will be explained. FIG. 10 is a schematic view showing the main components of this stepper.

This stepper comprises an illumination optical system 111, projecting optical system 112, wafer chuck 113, and wafer stage 114. The illumination optical system 111 irradiates a reticle 101 on which a desired pattern is drawn with illuminating light. The projecting optical system 112 projects the illuminating light (the pattern of the reticle 101) passing through the reticle 101 onto the surface of a wafer 102 in a reduced scale. The wafer chuck 113 mounts and fixes the wafer 102. The wafer stage 114 fixes the wafer chuck 113. Note that not only a transmission type reticle (reticle 101) shown in FIG. 10 but also a reflection type reticle can be used as a reticle.

The illumination optical system 111 includes an excimer laser oscillator 121 of the first embodiment, beam shape converter 122, optical integrator 123, stop member 124, condenser lens 125, blind 127, image forming lens 128, and reflecting mirror 129. The excimer laser oscillator 121 is a light source for emitting a high-luminance excimer laser beam as illuminating light. The beam shape converter 122 converts the illuminating light from the light source 121 into a beam having a desired sectional shape. The optical integrator 123 is formed by two-dimensionally arranging a plurality of cylindrical lenses or microlenses. The stop member 124 is placed near the position of secondary sources formed by the optical integrator 123 and can be switched to an arbitrary aperture value by a switching mechanism (not shown). The condenser lens 125 condenses the illuminating light passing through the stop member 124. The blind 127 is constructed of, e.g., four variable blades and placed on the conjugate plane of the reticle 101 to determine an arbitrary illuminating range on the surface of the reticle 101. The image forming lens 128 projects the illuminating light formed into a predetermined shape by the blind 127 onto the surface of the reticle 101. The reflecting mirror 129 reflects the illuminating light from the image forming lens 128 toward the reticle 101.

An operation of projecting the pattern on the reticle 101 onto the surface of the wafer 102 in a reduced scale by using the stepper constructed as above will be described below.

First, the illuminating light emitted from the light source 121 is converted into a predetermined shape by the beam shape converter 122 and directed to the optical integrator 123. Consequently, a plurality of secondary sources are formed near the exit surface of the optical integrator 123. Illuminating light from these secondary sources is condensed by the condenser lens 125 via the stop member 124 and formed into a predetermined shape by the blind 127. After that, the illuminating light is reflected by the reflecting mirror 129 via the image forming lens 128 and enters the reticle 101. Subsequently, the illuminating light enters the surface of the wafer 102 through the pattern of the reticle 101 and the projection optical system 112. As a consequence, the pattern of the reticle 101 is projected on the wafer 102 in a reduced scale, and the wafer 102 is exposed.

The exposure apparatus of this embodiment uses the excimer laser oscillator of the first or second embodiment as a laser source. This apparatus can therefore use a high-output and uniform excimer laser beam that can be sustained for a relatively long time period. This allows rapid exposure of the wafer 102 with an accurate exposure amount.

Next, a semiconductor device fabrication method using the projecting exposure apparatus explained with reference to FIG. 10 will be described below.

Figure 11:
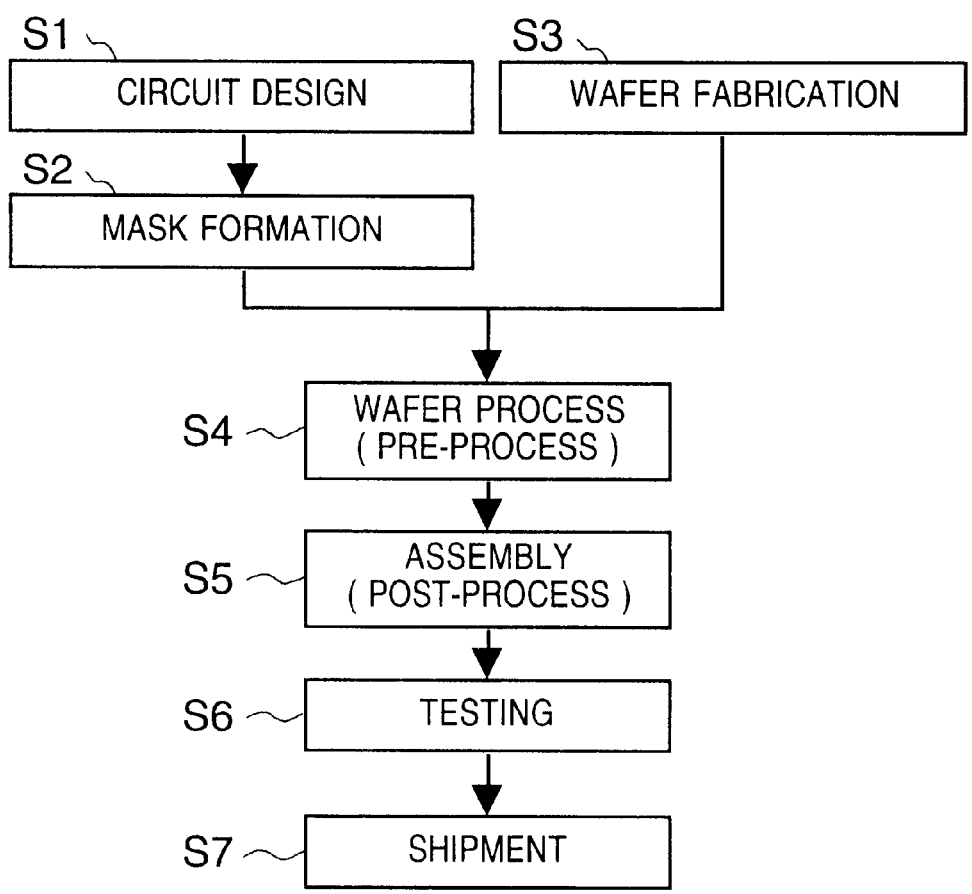
FIG. 11 is a flow chart showing the steps in manufacturing a semiconductor device using the stepper according to the third embodiment of the present invention.

FIG. 11 shows the flow of fabrication steps of semiconductor devices (e.g., semiconductor chips such as ICs and LSIs, liquid crystal panels, or CCDs). First, in step 1 (circuit design), circuits of semiconductor devices are designed. In step 2 (mask formation), a mask having the designed circuit patterns is formed. In step 3 (wafer fabrication), wafers are fabricated by using materials such as silicon. Step 4 (wafer process) is called a pre-process in which actual circuits are formed on the wafers by the photolithography technique by using the mask and wafers prepared as above. Step 5 (assembly) is called a post-process in which semiconductor chips are formed from the wafers formed in step 4. This process includes steps such as an assembly step (dicing and bonding) and a packaging step (chip encapsulation). In step 6 (testing), tests such as an operation test and a durability test are conducted on the semiconductor devices fabricated in step 5. The semiconductor devices are completed through these steps and shipped (step 7).

Figure 12:
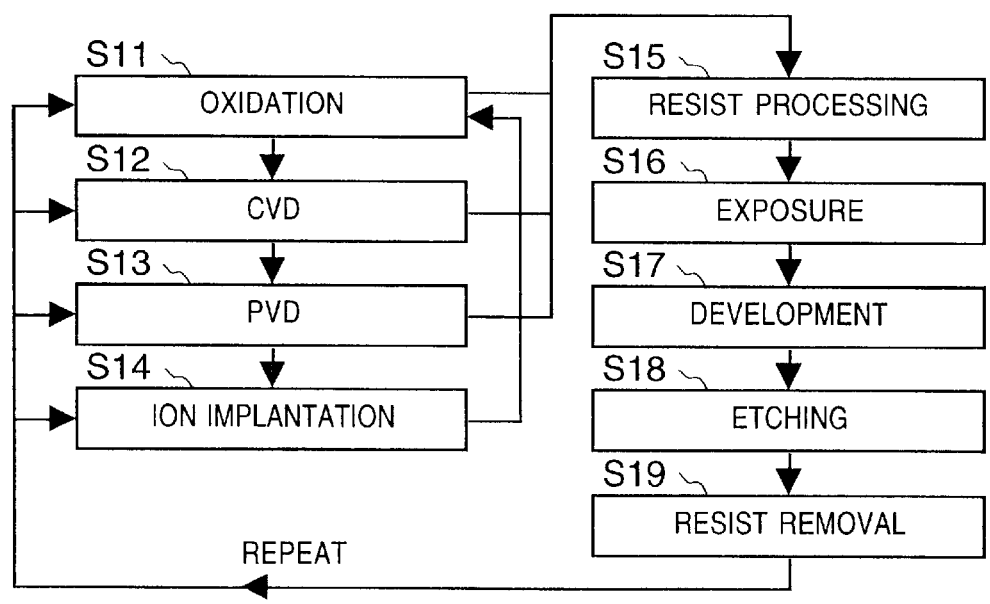
FIG. 12 is a flow chart showing the details of a wafer process in FIG. 11.
Figure 13A:
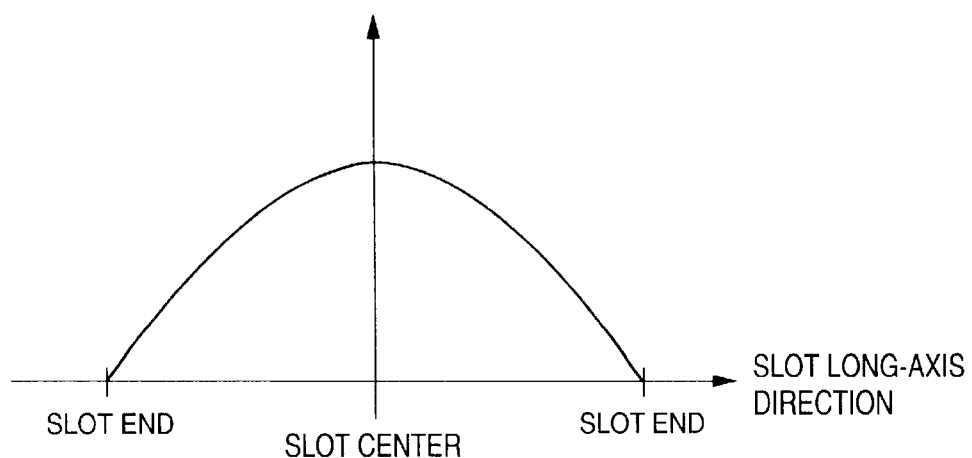
FIGS. 13A and 13B are schematic views showing an electric field intensity distribution and plasma density near a slot in a conventional excimer laser oscillating apparatus.
Figure 13B:
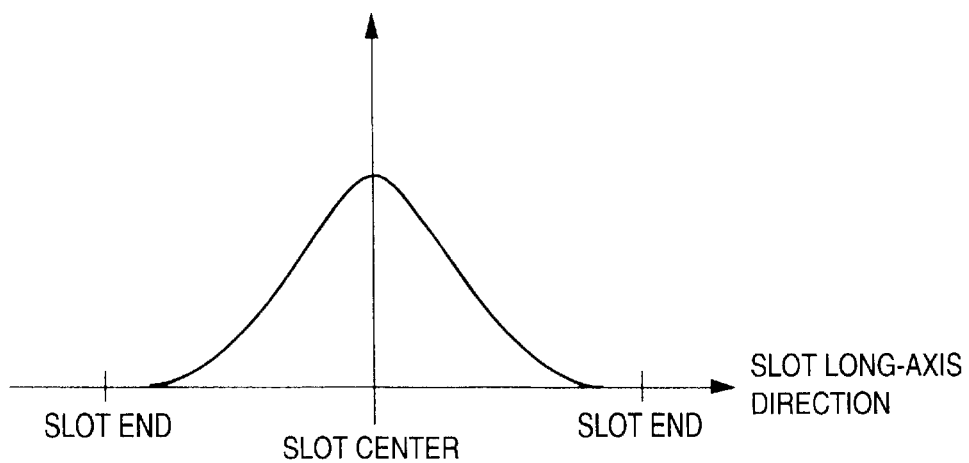

FIG. 12 shows a detailed flow of the wafer process described above. In step 11 (oxidation), the surfaces of the wafers are oxidized. Instep 12 (CVD), conductive films and insulating films are formed on the wafer surfaces by using vapor phase reaction. In step 13 (PVD), conductive films and insulating films are formed on the wafers by sputtering or vapor deposition. In step 14 (ion implantation), ions are implanted into the wafers. In step 15 (resist processing), the wafers are coated with a photosensitive agent. In step 16 (exposure), the projecting exposure apparatus explained above is used to expose the wafers to the circuit patterns of the mask. In step 17 (development), the exposed wafers are developed. In step 18 (etching), portions except for the developed resist image are etched away. In step 19 (resist removal), the unnecessary resist after the etching is removed. Multiple circuit patterns are formed on the wafers by repeating these steps.

This fabrication method can easily and reliably fabricate, with high yield, highly integrated semiconductor devices which are conventionally difficult to fabricate.

According to the present invention, a plasma which is uniform as a whole over the length of each slot can be generated. This makes it possible to provide a laser oscillating apparatus capable of uniform laser emission with minimum energy loss, a high-performance exposure apparatus having the laser oscillating apparatus, and a method of fabricating a high-quality device by using the exposure apparatus.

The present invention is not limited to the above embodiments and various changes and modifications can be made within the spirit and scope of the present invention. Therefore, to apprise the public of the scope of the present invention, the following claims are made.

What is claimed is:

1. A laser oscillating apparatus comprising:

a laser tube storing a laser gas;

a waveguide arranged to transmit an electromagnetic wave into the laser tube through a slot formed in a wall of the waveguide so as to excite the laser gas to generate plasma; and electrodes located around the slot.

2. The apparatus according to claim 1, wherein the electrodes are arranged to supply current to the laser gas so as to make a plasma density uniform along the slot.

3. The apparatus according to claim 1, wherein the electrodes are arranged to supply current to the laser gas to ionize the laser gas.

4. The apparatus according to claim 1, wherein the electrodes are arranged to supply current to the laser gas to ionize the laser gas before the electromagnetic wave is transmitted into the laser tube.

5. The apparatus according to claim 3, wherein the electrodes are arranged such that a density of the current supplied to the laser gas is higher at an end portion of the slot than at a central portion of the slot.

6. The apparatus according to claim 1, wherein the electrodes include a pair of electrodes sandwiching the slot.

7. The apparatus according to claim 6, wherein the pair of electrodes are shaped to make a density of the current supplied from the pair of the electrodes to the slot higher at an end portion of the slot than at a central portion of the slot.

8. The apparatus according to claim 1, wherein the electrodes include pairs of electrodes each pair sandwiching the slot, and the pairs of electrodes are distributed such that a density of the current supplied from the pairs of the electrodes to the slot is higher at an end portion of the slot than at a central portion of the slot.

9. The apparatus according to claim 1, the electrodes include pairs of electrodes each pair sandwiching the slot, and a distribution density of the pairs of electrodes is higher around an end portion of the slot than around a central portion of the slot.

10. The apparatus according to claim 6, wherein widths of the pair of electrodes are wider around an end portion of the slot than around a central portion of the slot.

11. The apparatus according to claim 6, wherein a distance between the pair of electrodes is larger around an end portion of the slot than around a central portion of the slot.

12. A laser oscillating apparatus comprising:

a laser tube storing laser gas;

a waveguide arranged to transmit an electromagnetic wave into the laser tube through a slot formed in a wall of the waveguide so as to excite the laser gas to generate plasma; and a light source arranged outside of the laser tube to irradiate the wall in which the slot is formed with light.

13. The apparatus according to claim 12, wherein the waveguide is placed between the light source and the laser tube, and the waveguide has a window transmitting light from the light source.

14. The apparatus according to claim 13, wherein a wall of the waveguide in which the window is formed opposes the wall of the waveguide in which the slot is formed.

15. The apparatus according to claim 13, wherein the window has a size that disables the electromagnetic wave from passing through.

16. The apparatus according to claim 12, wherein the light source includes a reflecting mirror arranged to reflect light from the light source toward an edge portion of the slot.

17. The apparatus according to claim 12, wherein the light source generates ultraviolet light.

18. The apparatus according to claim 12, wherein a plurality of the slots are formed along a longitudinal direction of the waveguide.

19. An exposure apparatus comprising:

a laser oscillating apparatus according to claim 1;

an illumination optical system for generating illuminating light for illuminating a mask by using illuminating light supplied from the laser oscillating unit; and a projection optical system for projecting a pattern of the mask illuminated with the illuminating light generated by the optical system onto a substrate.

20. A device manufacturing method comprising the steps of:

coating a substrate with a photosensitive material;

exposing a pattern on the substrate coated with the photosensitive material by using the exposure apparatus defined in claim 19; and developing the pattern on the exposed substrate.

21. The apparatus according to claim 1, wherein a plurality of the slots are formed along a longitudinal direction of the waveguide.

22. The apparatus according to claim 21, wherein the electrodes are provided for each of the plurality of slots.

23. An exposure apparatus comprising:

a laser oscillating apparatus according to claim 12;

an illumination optical system for generating illuminating light for illuminating a mask by using illuminating light supplied from the laser oscillating unit; and a projection optical system for projecting a pattern of the mask illuminated with the illuminating light generated by the optical system onto a substrate.

24. A device manufacturing method comprising the steps of:

coating a substrate with a photosensitive material;

exposing a pattern on the substrate coated with the photosensitive material by using the exposure apparatus defined in claim 23; and developing the pattern on the exposed substrate.

25. A laser oscillating apparatus comprising:

a laser tube storing a laser gas;

a waveguide arranged to transmit an electromagnetic wave into the laser tube through a slot formed in a wall of the waveguide; and an energy supply arranged to supply additional energy other than electromagnetic wave supplied via the waveguide to the laser gas such that the additional energy supplied to the laser gas is higher at an end portion of the slot than at a central portion of the slot.

26. The apparatus according to claim 25, wherein the energy supply include electrodes located around the slot.

27. The apparatus according to claim 25, wherein the energy supply includes a light source.

28. The apparatus according to claim 27, wherein the light source emits ultraviolet light.

29. An exposure apparatus comprising:

a laser oscillating apparatus according to claim 25;

an illumination optical system for generating illuminating light for illuminating a mask by using illuminating light supplied from the laser oscillating apparatus; and a projection optical system for projecting a pattern of the mask illuminated with the illuminating light generated by the illumination optical system onto a substrate.

30. A device manufacturing method comprising the steps of:

coating a substrate with a photosensitive material;

exposing a pattern on the substrate coated with the photosensitive material by using the exposure apparatus defined in claim 29; and developing the pattern on the exposed substrate.

* * * * *

UNITED STATES PATENT AND TRADEMARK OFFICE
CERTIFICATE OF CORRECTION

PATENT NO. : 6,650,678 B2
DATED : November 18, 2003
INVENTOR(S) : Tadahiro Ohmi et al.

It is certified that error appears in the above-identified patent and that said Letters Patent is hereby corrected as shown below:

Column 1,
Line 43, "uniformize" should read -- make uniform --.

Column 3,
Line 11, "electrode" should read -- electrodes --; and
Line 46, "generate" should read -- generates --.

Column 4,
Lines 34 and 46, "uniformized" should read -- made uniform --.

Column 6,
Lines 17 and 46, "uniformizing" should read -- making uniform --;
Line 32, "uniformized," should read -- made uniform, --; and
Line 60, "informize" should read -- make uniform --.

Column 7,
Line 11, "uniformize" should read -- make uniform --.

Column 8,
Line 33, "uniformized" should read -- made uniform --;
Line 45, "uniformized." should read -- made uniform --; and
Line 52, "uniformize" should read -- make uniform --.

Column 12,
Line 34, "electromagnetic" should read -- the electromagnetic --; and
Line 39, "include" should read -- includes --.

Signed and Sealed this

Fifteenth Day of June, 2004

JON W. DUDAS
*Acting Director of the United States Patent and Trademark Office*